United States Patent [19]

Mohri et al.

[11] Patent Number: 5,698,015

[45] Date of Patent: Dec. 16, 1997

[54] CONDUCTOR PASTE FOR PLUGGING THROUGH-HOLES IN CERAMIC CIRCUIT BOARDS AND A CERAMIC CIRCUIT BOARD HAVING THIS CONDUCTOR PASTE

[75] Inventors: Mamoru Mohri, Nomi-gun; Motoharu Miyakoshi, Kaga; Kiyoshi Mizushima, Matto, all of Japan

[73] Assignee: Nikko Company, Matto, Japan

[21] Appl. No.: 622,663

[22] Filed: Mar. 26, 1996

[30] Foreign Application Priority Data

May 19, 1995 [JP] Japan ................... 7-121260

[51] Int. Cl.⁶ .................. B22F 7/00; C09D 5/00; B32B 3/00; B32B 18/00
[52] U.S. Cl. .................. 106/1.13; 106/1.14; 106/1.15; 428/210; 428/325; 428/328; 428/434; 428/469; 428/471; 428/472; 428/669; 252/518; 252/521
[58] Field of Search .................. 428/210, 209, 428/432, 325, 328, 434, 469, 471, 472, 669, 901; 106/1.13, 1.14, 1.15

[56] References Cited

U.S. PATENT DOCUMENTS

| | | | |
|---|---|---|---|
| 3,502,489 | 3/1970 | Cole | 428/210 |
| 3,827,891 | 8/1974 | Larry | 428/210 |
| 4,766,027 | 8/1988 | Burn | 428/210 |
| 4,835,039 | 5/1989 | Barringer et al. | 428/210 |
| 4,861,646 | 8/1989 | Barringer et al. | 428/210 |

FOREIGN PATENT DOCUMENTS

| | | |
|---|---|---|
| 794840 | 4/1995 | Japan . |
| 7235215 | 9/1995 | Japan . |

OTHER PUBLICATIONS

Mohri et al., Control of through-hole in Low Temperature Fired Substrate with Alumina Substrate Core, Jun. 1993, pp. 95–98 Japan.

Primary Examiner—Cathy F. Lam

[57] ABSTRACT

A conductor paste for plugging a through-hole in a ceramic substrate which includes an electrically conductive powder having a metal powder as its main component, a swelling agent and a vehicle, and may also include adhesion improvers. After sintering the conductor paste, a conductor plug is created which will not fall out of the through-hole, is resistant to chipping during the leveling process and may be gas impermeable.

26 Claims, 4 Drawing Sheets

Effect of the Addition of Swelling Agent
on the Diameter of Sintered Conductor Plugs Consolidation Stability of Plug After Resintering Consolidation Stability of Plug After Resintering

CONDUCTOR PASTE FOR PLUGGING THROUGH-HOLES IN CERAMIC CIRCUIT BOARDS AND A CERAMIC CIRCUIT BOARD HAVING THIS CONDUCTOR PASTE

BACKGROUND OF THE INVENTION

A. Field of the Invention

The present invention relates to a conductor paste for plugging a through-hole formed to connect wiring circuits formed on the opposing faces of a ceramic substrate. This invention also relates to a ceramic circuit board which incorporates this paste. More particularly, this invention relates to a conductor paste for plugging a through-hole in a ceramic single layer substrate, for plugging a through-hole in a ceramic multi-layer substrate, or for plugging a through-hole formed in an IC or transistor package substrate, as well as the ceramic circuit boards which incorporate this paste.

B. Description of the Related Art

In general, a ceramic circuit board is formed by printing a paste containing an electrically conductive powder, such as Ag powder, a mixture of Ag and Pd powders, a mixture of Ag and Pt powders, or Cu powder, onto a ceramic substrate, typically containing 96% alumina, by screen printing the paste onto the substrate and then sintering both at around 800°–900° C.

In recent years, with the advances which have been made in the miniaturization and performance levels of electronic devices, a demand has arisen for multi-layered ceramic circuit boards which are highly reliable and on which electronic parts can be installed at a higher density. A common means for increasing circuit density is to form wiring circuits on both faces of the substrate, with a through-hole being formed in the substrate to connect the wiring circuits on the opposing faces.

One method of connecting circuits using a through-hole is to print a conductor onto the wall face of the through-hole, while another method is to plug the through-hole with a conductor plug. With the plugging method, the conductor plug generally consists of a conductor paste containing an electrically conducting powder, which is inserted into the through-hole and sintered.

However, the plugging method is often inadequate in that the conductor plug tends to shrink and fall out of the through-hole after sintering due to the fact that the shrinkage force of the electrically conductive powder exceeds the adhesion strength between the conductor plug and the ceramic substrate. Another problem that plagues the plugging method is that the conductor plug tends to chip during the leveling process, i.e., the process of removing protruding portions of the conductor plug by grinding. Protrusions often occur after the plugging process because in order to plug the conductor paste into a through-hole with a diameter of 0.3 mm, it is necessary to use a printing plate which has a pat-pattern of a diameter of about 0.5 mm to accommodate the dimensional tolerance of the substrate to be printed. Consequently, conventional methods for connecting circuits via a through-hole have been practically limited to printing a conductor onto the wall face of the through-hole.

The applicant has already suggested a low shrinkage conductor paste for plugging through-holes which has rhodium powder incorporated into it (Japanese Patent Application No. 6-51306). The low shrinkability of this paste prevents the conductor plug from falling out of the substrate and has contributed to the improvement in wiring circuit density on ceramic substrates, but the conductor plug still suffers from the problem of chipping during the leveling process.

Conductor pastes are also used in the field of package substrates, which are another application for ceramic circuit boards. These substrates may be produced using multi-layer substrate technology in which green (unsintered) sheets of about 92% alumina are laminated together and sintered at a high temperature. A package substrate, an example of which is shown in FIG. 1, has an active part 7, such as IC or a quartz oscillator, mounted on a substrate 3, with the active part 7 being covered by a metal cap 6. Through-holes 2 are formed in the substrate 3 and a conductor plug 1 is plugged into the holes connecting the active part 7 to an environment outside of the metal cap 6. This serves to release heat which builds up within the metal cap 6. An inactive gas is sealed within the metal cap 6 to prevent deterioration of the active part 7. Hence, it is important that the seal between the cap and the substrate have a very low level of gas permeability.

When multi-layered package substrates are made from 92% alumina, gas permeability is maintained at a very low level by the fact that the package is multi-layered. Substrates made from 96% alumina have a very low level of gas permeability even when they are single-layered. When a through-hole in a 92% alumina multi-layered package substrate is to be plugged, the conductor paste and the substrate itself are sintered at the same time. In this case, a very low level of gas permeability in the through-hole is obtained only if the amount of shrinkage in the conductor plug and the substrate are matched. When a package board or the like is produced from a 96% alumina substrate, the through-hole is plugged with an unsintered conductor paste after the substrate has been sintered. When the package is resintered, a small gap between the through-hole wall face and the conductor plug will often form, even when a conductor paste that has low shrinkage is used, therefore making it difficult for the through-hole to have a very low level of gas permeability.

SUMMARY OF THE INVENTION

According to one embodiment of the present invention, a conductor paste for plugging a through-hole formed in a ceramic substrate comprises an electrically conductive powder which has a metal powder as its main component, a swelling agent and a vehicle, with the swelling agent preferably having the ability to consolidate.

In yet another embodiment of the present invention, the conductor paste includes at least one metal powder selected from the group consisting of gold powder, silver powder, copper powder, a mixture of silver and platinum powders, and a mixture of silver and palladium powders, with the average particle size of the metal powder being in a range between 1–100 μm.

In yet another embodiment of the present invention, the conductor paste includes a swelling agent that is at least one type selected from the group consisting of the aluminosilicate-based compounds, barium titanate, calcium titanate, lead titanate, lead zirconate, ferrite, PTZ and PTF, and more preferably is an aluminosilicate-based compound represented by the general formula $RO-Al_2O_3-SiO_2$, where R represents an alkaline metal or an alkaline earth metal, and the swelling agent is present in a range of 0.5–15 parts by weight per 100 parts by weight of the electrically conductive powder.

In yet another embodiment of the present invention, the vehicle comprises a binder and a solvent. The vehicle is preferably in a range between 10–45 parts by weight per 100 parts by weight of electrically conductive powder, the binder is at least one type selected from the group consisting of ethylcellulose and acrylic resin and is preferably present in a range between 2-10 parts by weight per 100 parts by weight of the electrically conductive powder, and the solvent is at least one type selected from the group consisting of ethylcarbitol acetate and terpineol and is preferably present in a range between 300-2000 parts by weight per 100 parts by weight of the binder.

In yet another embodiment of the present invention, the conductor paste includes an adhesion improver that is preferably glass having a softening point of 500°-1000° C., such as PbO, $B_2O_3$, ZnO, CaO, $SiO_2$ and $Al_2O_3$.

In yet another embodiment of the present invention, the conductor paste includes an auxiliary adhesion improver, and is preferably at least one selected from the group consisting of $TiO_2$, CuO, $Cr_2O_3$, $Bi_2O_3$ and NiO.

In yet another embodiment of the present invention, the conductor paste includes rhodium powder, preferably at least 0.1 percent by weight, and not more than 3.01 percent by weight, relative to the electrically conductive powder and with an average particle size between 0.1-2.0 μm.

This invention is also directed toward a ceramic circuit board, comprising a ceramic substrate having a through-hole plugged with a conductor paste, the conductor paste comprising an electrically conductive powder which has a metal powder as its main component, a swelling agent and a vehicle, with both the substrate and the conductor paste being sintered. Wiring circuits are then formed on opposing faces of the ceramic substrate, with parts of circuits being in contact with the sintered conductor paste that fills the through-hole.

This invention is also directed toward a package substrate comprising, in combination:

a) a ceramic layered structure having opposing faces and a through-hole extending between the opposing faces, with each of the opposing faces having a wiring circuit portion engaging the conductor paste in the through-hole, with the ceramic layered structure having at least two layers of a ceramic substance to be sintered together;

b) an active electrical part on one of the opposing faces and electrically engaging the conductor paste in the through-hole;

c) a seal disposed over the active part and engaged to the laminate structure about the active part such that fluid may be trapped between the seal and the laminate structure;

d) an inactive gas trapped between the seal and the laminate structure to prevent deterioration of the active electrical part; and e) a conductor paste for plugging the through-hole, with the conductor paste comprising, in combination: a vehicle, a swelling agent in the vehicle, and an electrically conductive powder in the vehicle, with the electrically conductive powder having a metal powder as its main component, with the vehicle, swelling agent, and electrically conductive powder being mixed, with swelling of the swelling agent being initiated by sintering of the conductor paste, with the conductor paste being sintered after being inserted into the through-hole of the ceramic layered structure to permit swelling of the swelling agent and conductor paste to maximize the plugging of the through-hole and minimize leakage of the inactive gas through the through-hole.

This invention is also directed toward a method for plugging a through-hole in a ceramic substance, comprising, in combination, the steps of:

a) mixing a vehicle, an electrically conductive powder, and a swelling agent to form a conductor paste, with swelling of the swelling agent being initiated by application of heat to thereby initiate swelling of the conductor paste;

b) inserting the conductor paste into the through-hole; and c) sintering the conductor paste to thereby permit swelling of the swelling agent and conductor paste to maximize the plugging of the through-hole in the ceramic substance.

In an embodiment of this method, the ceramic substance has opposing faces, the swelling agent includes a crystal phase which appears during the step of sintering the conductor paste, with the crystal phase remaining stable and shrinking uniformly after the step of sintering whereby the powder forms consolidated sinters, and the step of inserting the conductor paste into the through-hole includes inserting a sufficient quantity of conductor paste into the through-hole such that, after the step of sintering and after the sinters have consolidated, the consolidated sinters extend beyond the opposing faces, and a step of leveling the opposing faces is further comprised.

This invention is also directed toward a method for plugging a through-hole in a ceramic layered structure having at least two layers of a ceramic substance to be sintered together, with the method comprising, in combination, the steps of:

a) mixing a vehicle, an electrically conductive powder, and a swelling agent to form a conductor paste, with swelling of the swelling agent being initiated by sintering to thereby initiate swelling of the conductor paste;

b) inserting the conductor paste into the through-hole; and c) sintering the at least two layers of the ceramic substance together so as to also sinter the conductor paste to thereby permit swelling of the conductor paste to maximize the plugging of the through-hole in the ceramic substance.

In an embodiment of this method, a step of leveling opposing faces of the ceramic layered structure after the step c) is further comprised.

These and other objects and the advantages of the present invention will be more fully apparent from the following detailed disclosure.

DETAILED DESCRIPTION OF THE PREFERRED EMBODIMENTS

A. Conductor Paste

Figure 1:
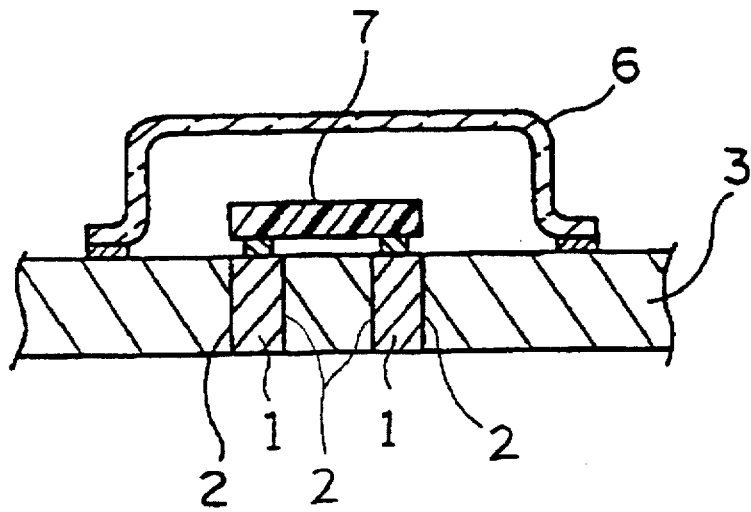
FIG. 1 is a cross section showing a typical package substrate.

It is an object of the present invention to minimize the possibility of a conductor plug from falling out of a through-hole in ceramic substrates and to reduce the amount of chipping in the conductor plug during the leveling process.

It is another object of the present invention to decrease the gas permeability of a plugged through-hole formed in a package board.

Therefore, according to the present invention, a very low shrinkage conductor paste for plugging through-holes contains an electrically conductive powder which has a metal powder as its main component, a swelling agent, and a vehicle. The expression "very low shrinkage" in this specification signifies involving almost no thermal shrinkage during sintering.

The electrically conductive powder material used in the conductor paste of the present invention can be any substance that has the ability to conduct an electrical charge, and the metal powder material is generally the same as the metal powder used to form wiring circuits on ceramic substrates. Typically, it is a simple metal powder, such as gold powder, silver powder or copper powder, or a mixture of powders, such as silver and palladium powders or silver and platinum powders, and in fact may be a mixture of two or more of these. The metal powder particles may be in the shape of a sphere, an agglomerated mass, a needle, a scale, or the like. The average particle size of the metal powder is preferably not smaller than 3 μm, more preferably not smaller than 5 μm, for suppressing the thermal shrinkage to a lower level during the sintering. In addition, the average particle size of the metal powder is preferably not larger than 100 μm, more preferably not larger than 70 μm, for increasing the packing ratio of the metal powder and thereby obtaining a finer sinter. The average particle size of the metal powder is, for example, in a range of 1–100 μm and preferably in a range of 2–70 μm, and it is more preferably in a range of 3–70 μm, still more preferably in a range of 5–70 μm, for effecting in good balance both the more increase in the packing ratio of the metal powder and the suppression of the thermal shrinkage to a lower level during the sintering. A metal powder having an average particle size smaller than the above-mentioned range can be used in combination with a metal powder having an average particle size within the above-mentioned range for the purpose of obtaining a finer sinter or improving the printability.

With regard to the swelling agent to be used in the conductive paste, no particular limitation is imposed upon it provided that it is a substance which swells during sintering. However, substances which exhibit a superior ability to consolidate after swelling are especially desirable. The term "ability to consolidate" as used in this invention refers to the ability of a crystal phase to appear in the swelling agent during sintering but remain stable and cease swelling after sintering. In practical terms, the swelling agent should have the ability to swell during sintering and then shrink monotonically to form consolidated sinters.

Swelling agents which have such an ability to consolidate include, for example, aluminosilicate-based compounds, barium titanate, calcium titanate, lead titanate, lead zirconate, ferrites such as $ZnFe_2O_4$ and $CdFe_2O_4$, PTZ, PTF and the like. Here, PTZ and PTF signify sinters obtained by sintering reactions (1) and (2) indicated below respectively.

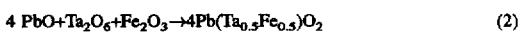

The aluminosilicate-based compounds are, for example, compounds which can be represented by a general formula $RO$, $Al_2O_3$, and $SiO_2$ (where R represents an alkaline metal or alkaline earth metal). In practical terms they are aluminosilicate-based compounds such as anorthite ($CaO.Al_2O_3.2SiO_2$) and celsian ($BaO.Al_2O_3.2SiO_2$). These compounds are also calcined materials which may be obtained by a method as described below. First, kaolin and a substance derived from of a group II metal element are calcined. On calcination, they form an amorphous mixture which has high reactivity and which exhibits viscous flow during resintering. When the mixture is sintered it swells in a viscous flow region (in the presence of Ag) and when the viscosity increases a crystal phase forms and finally the mixture consolidates. The resultant consolidated product forms a sinter which does not swell but retains its shape.

The proportion of the aforementioned swelling agent used is preferably in a range of 0.5–15 percent by weight, and more preferably 1.0–7.0 percent by weight, relative to the electrically conductive powder. When the proportion used is less than 0.5 percent by weight, the swelling action is weak and a gap is created between the wall face of the through-hole and the conductor plug. When the proportion exceeds 7.0 percent by weight, the resultant sinter has a coarse structure, which results in a rise in the resistance value of the conductor plug. Any of the aforementioned swelling agents can be used either alone or in combination with each other.

The vehicle contains a binder and a solvent. Ethylcellulose, acrylic resin, or the like can be used as the binder, and ethylcarbitol acetate, terpineol, or the like can be used as the solvent. Any combination of binder and solvent type may be utilized. The amount of the binder used is around 2–10 parts by weight per 100 parts by weight of the electrically conductive powder. The amount of the solvent used differs according to the type of the binder which is used, but it typically is around 300–2000 parts by weight per 100 parts by weight of the binder. A preferable vehicle is TRD-1, manufactured by the Tanaka Precious Metals International Co. The amount of the vehicle used is typically around 10–45 parts by weight per 100 parts by weight of the unsintered powder mixture.

The conductor paste of the present invention preferably further contains an adhesion improver for improving adhesion to the ceramic substrate. The adhesion improver preferably used in the present invention may be one or a combination of standard glass components such as PbO, $B_2O_3$, ZnO, CaO, $SiO_2$ and $Al_2O_3$, and it is preferably glass which has a softening point of 500°–1000° C. and more preferably 600°–900° C. When glass having a softening point below 500° C. is used, the viscosity of the adhesion improver is too low during sintering and only a small amount is transferred to the wall face of the through-hole. This not only makes no contribution to the junction between the conductor plug and the wall face of the through-hole, but it also increases the amount of shrinkage in the conductor plug and causes the conductor plug to peel away from the wall face of the through-hole. When glass which has a softening point in excess of 1000° C. is used, the glass is not properly softened during sintering and this also affects the adhesion quality.

The proportion of the aforementioned adhesion improver used is preferably in a range of 1.0–10 percent by weight, and more preferably 3.0–8.0 percent by weight, relative to the electrically conductive powder. When the proportion used is less than 1.0 percent by weight, the adhesion to a ceramic substrate is very weak. When the proportion exceeds 10 percent by weight, the shrinkage of the resultant sinter is promoted and the consolidatability of the sinter is lost.

The conductor paste of the present invention preferably further contains an auxiliary adhesion improver. At least one material selected from the group consisting of $TiO_2$, CuO, $Cr_2O_3$, $Bi_2O_3$ and NiO is preferred as the auxiliary adhesion improver since it can form a glass component which exhibits similar properties to the adhesion improver and further improves the adhesion between the conductor plug and the ceramic substrate. The auxiliary adhesion improver is not limited to these oxides provided that the compound or compounds selected further improves the adhesion between the conductor plug and the ceramic substrate.

The proportion of the aforementioned auxiliary adhesion improver used is preferably in a range of 0.1–6 percent by weight, and more preferably 0.3–3 percent by weight, relative to the electrically conductive powder. When the proportion used is less than 0.1 percent by weight, the formation of an adhesion reaction layer is poor. When the proportion exceeds 6 percent by weight, the resultant sinter has a coarse structure, which results in a rise in the resistance value of the conductor.

Rhodium (Rh) powder may also be added to the conductor paste of the present invention in order to further suppress shrinkage due to sintering.

The amount of rhodium powder to be added is preferably at least 0.1 percent by weight and not more than 3.0 percent by weight, and more preferably at least 0.6 percent by weight and not more than 3.0 percent by weight, relative to the electrically conductive powder. When the amount added is less than 0.1 percent by weight, the amount of shrinkage that is inhibited is slight. When the amount added exceeds 3.0 percent by weight, the amount of metal powder in the conductor paste is relatively lowered and so the resistance value of the conductor plug is increased. Furthermore, the use of an excessive amount of rhodium is undesirable since it is very expensive.

The aforementioned rhodium powder can be used in any form such as a spherical, agglomerated, needle-like or scale-like form, and its average particle size is preferably in a range of 0.1–2.0 μm, and more preferably 0.5–1.2 μm. When the average particle size is less than 0.1 μm, conductor plug shrinkage is only slightly suppressed. When the average particle size exceeds 2.0 μm, conductor plug shrinkage is not suppressed uniformly.

The conductor paste may also contain additives such as aliphatic esters in order to impart a suitable degree of fluidity to the paste prior to sintering.

The conductor paste of the present invention may be manufactured by simply kneading together the electrically conductive powder, the swelling agent and the vehicle into a raw material powder, or a kneaded mixture of the vehicle and additives such as the swelling agent may be added to another kneaded mixture of the electrically conductive powder and the vehicle and then kneaded together. A kneading machine such as a three-roll mill may be used or, preferably, a pulverizing machine.

When plugging a through-hole formed in a ceramic substrate with the conductor paste of the present invention, it is preferably done in such a way that an open part of the through-hole is covered using a metal mask. The metal mask is a metal plate which has a hole the diameter of which is no smaller than the diameter of the through-hole and in a position which corresponds to the through-hole in the substrate. The plugging of the through-hole is preferably carried out by screen printing or metal mask printing as is generally done in thick film printing technology.

The sintering temperature is preferably in a range of 750°–1000° C., and more preferably 800°–950° C. When the temperature is lower than 750° C., the electrically conductive powder is unsatisfactorily sintered and so the resultant sinter is coarse and the resistance value of the conductor is increased. Furthermore, the consolidatability of the sinter is lost because the sinter is not crystallized. When the temperature exceeds 1000° C., the adhesion improver may bubble or the conductor powder may be over-sintered. The sintering of the conductor paste is preferably carried out for about 60 minutes using a continuous sintering or batch furnace.

Leveling of the substrate is carried out after sintering, as required. The leveling process is preferably carried out such that the protruding portion of the conductor plug is ground away evenly and removed.

Figure 2:
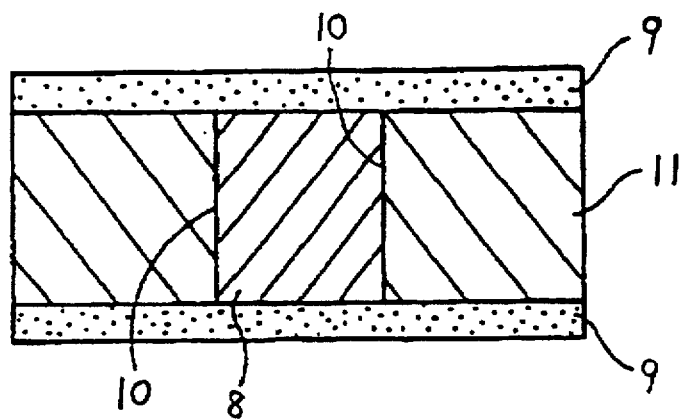
FIG. 2 is a cross section of a ceramic substrate similar to that shown in FIG. 1 constructed with a conductor plug in accordance with one embodiment of the present invention.
Figure 3:
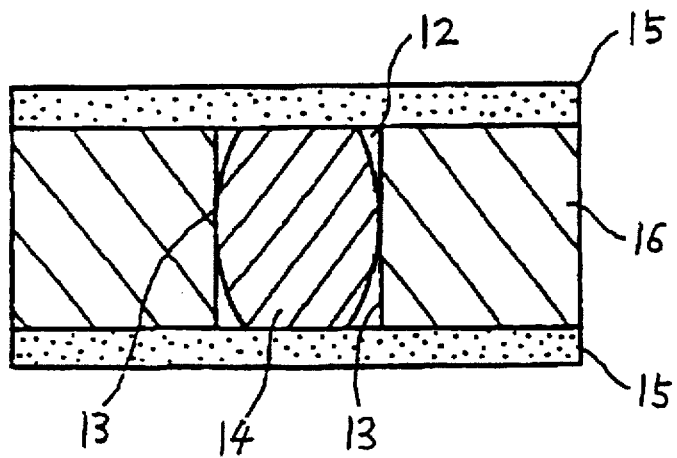
FIG. 3 is a cross section of a ceramic substrate which includes a prior art conductor plug inserted into a through-hole.
Figure 4:
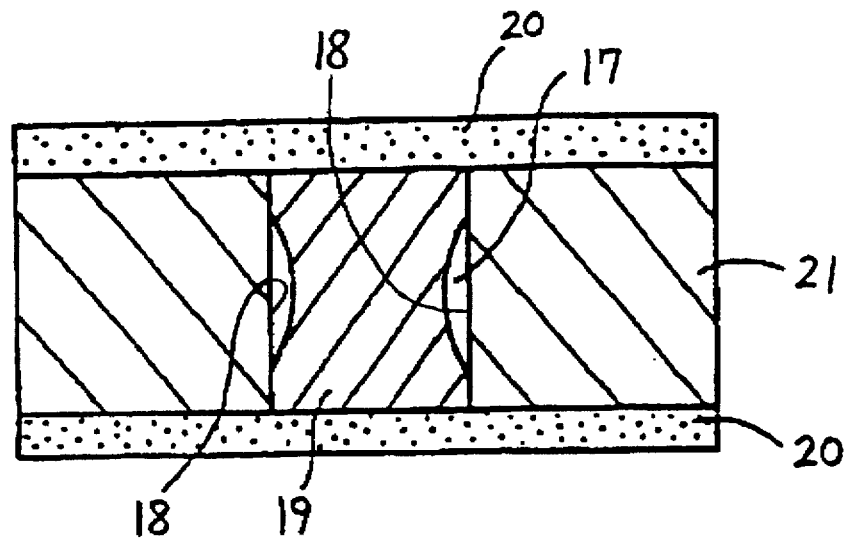
FIG. 4 is another cross section of a ceramic substrate which includes a prior art conductor plug inserted into a through-hole.

A ceramic substrate with a through-hole plugged with the conductor plug of the present invention will now be described with reference to the drawings. In FIG. 2, a conductor plug 8 connected to wiring circuits 9 is disposed in the through-hole 10 of substrate 11 so as to leave no gaps between the wall face of the through-hole and the conductor plug 8. Due to the addition of a swelling agent, the conductor plug 8 will not fall out of the through-hole 10 and, in the case of package substrates, the gas permeability of the through-hole 10 is extremely low. However, there are cases, as shown in FIG. 3 and FIG. 4, having respective substrates 16 and 21, where gaps 12 and 17 are formed between the wall face of through-holes 13 and 18 and the conductor plugs 14 and 19 because they are only partially swollen. There is no adverse effect in the connection between the wiring circuits 15 and 20 when such gaps exist in a ceramic circuit board. However, there is a problem with gas permeability when it is used in a package substrate.

B. Ceramic Circuit Board and Package Substrate

A ceramic circuit board according to the present invention includes a ceramic substrate which has a through-hole plugged with any of the above-mentioned conductor pastes and sintered, as well as wiring circuits which are formed on the opposing faces of the ceramic substrate and connected with each other via the conductor plug in the through-hole.

The ceramic substrate may be either a single layer or a laminate of a plurality of layers. Furthermore, conventional methods can be used to manufacture and laminate the ceramic substrates.

The wiring circuits may be formed from simple metal powders, such as gold powder, silver powder, and copper powder, and mixtures of powders, such as silver and palladium powders and silver and platinum powders, which, as mentioned earlier, are generally used in the manufacture of ceramic circuit boards. The wiring circuits may be produced by conventional methods.

In the present invention, the parts of the wiring circuits which cross over the through-hole are in contact with the conductor plug. Hence, when manufacturing a ceramic multi-layer wiring board, the wiring circuits are insulated in order to eliminate the need to route the circuits around the conductor plug. However, when the through-hole of a ceramic multi-layer wiring board is not plugged with a conductor plug, a green sheet placed on top of the throughhole may sink into it and crack. With the ceramic circuit board of the present invention, a wiring circuit which is highly reliable and has no wiring breaks can be constructed on the substrate.

When a conductor paste of the present invention contains a swelling agent that has the ability to consolidate, the swelling action of the agent causes a chemical and physical union between the added adhesion and/or auxiliary adhesion improver and the components from which the wall face through-hole is constructed such that virtually no gap forms between the conductor plug and the wall face of the through-hole after sintering. Furthermore, once the swelling agent has consolidated, it does not swell any further, thus allowing its shape to be retained. As a result, even if the wiring circuit printed onto the ceramic substrate is sintered after the through-hole is plugged with the conductor plug, shrinkage or expansion of the conductor plug is very unlikely to occur. Hence, in addition to suppressing the thermal shrinkage of the conductor plug, the stability of the union with the ceramic substrate and its gas permeability characteristics are maintained. In addition, when a leveling process is carried out, the conductor plug almost never chips or falls out of the through-hole.

Another advantage of the conductor paste of the present invention is that when shrinkage is suppressed, the junction between the wall face of the through-hole and the conductor plug is adequately maintained and the reliability of the connection between the through-hole conductor and a wiring circuit is improved. Furthermore, in comparison with conventional types, the amount of conductive material within the through-hole is increased and so the conductor resistance is reduced.

If the aforementioned swelling agent is at least one type selected from the group consisting of aluminosilicate-based compounds, barium titanate, calcium titanate, lead titanate, lead zirconate, ferrite, PTZ and PTF, the amount of shrinkage in the conductor paste after sintering is further improved, as well as the reliability of the connection between the conductor plug and the wiring circuit.

If the aforementioned aluminosilicate-based compound is a compound which can be represented by the general formula RO—$Al_2O_3$—$SiO_2$ (where R represents an alkaline metal or an alkaline earth metal), even further improvement in the amount of shrinkage in the conductor paste after sintering is shown, as well as further improvement in the reliability of the connection between the conductor plug and the wiring circuit.

If the conductor paste of the present invention further contains an adhesion improver, there is further improvement in the adhesion strength between the conductor plug and the ceramic substrate and, moreover, if the paste is plugged into a through-hole formed in a package substrate, the gas permeability of the through-hole can be maintained at a very low level.

If the aforementioned adhesion improver is glass which has a softening point of 500°–1000° C., the gas permeability of the through-hole in a package substrate is maintained at an even lower level.

If the conductor paste of the present invention further contains an auxiliary adhesion improver, there is a further improvement in the adhesive strength between the conductor and the ceramic substrate and, moreover, there is further reduction in the gas permeability of the through-hole in a package substrate.

If the aforementioned auxiliary adhesion improver is at least one type selected from the group consisting of $TiO_2$, CuO, $Cr_2O_3$, $Bi_2O_3$ and NiO, the gas permeability of the through-hole in a package substrate is even further reduced.

If the conductor paste further contains rhodium powder in an amount of at least 0.1 percent by weight and not more than 3.0 percent by weight relative to the aforementioned electrically conductive powder, there is additional improvement in the amount of shrinkage in the conductor paste after sintering.

A package substrate according to the present invention includes, in combination:

a) a ceramic layered structure having opposing faces and a through-hole extending between the opposing faces, with each of the opposing faces having a wiring circuit portion engaging the conductor paste in the through-hole, with the ceramic layered structure having at least two layers of a ceramic substance to be sintered together;

b) an active electrical part on one of the opposing faces and electrically engaging the conductor paste in the through-hole;

c) a seal disposed over the active part and engaged to the laminate structure about the active part such that fluid may be trapped between the seal and the laminate structure;

d) an inactive gas trapped between the seal and the laminate structure to prevent deterioration of the active electrical part; and e) a conductor paste for plugging the through-hole, with the conductor paste including, in combination: a vehicle, a swelling agent in the vehicle, and an electrically conductive powder in the vehicle, with the electrically conductive powder having a metal powder as its main component, with the vehicle, swelling agent, and electrically conductive powder being mixed, with swelling of the swelling agent being initiated by sintering of the conductor paste, with the conductor paste being sintered after being inserted into the through-hole of the ceramic layered structure to permit swelling of the swelling agent and conductor paste to maximize the plugging of the through-hole and minimize leakage of the inactive gas through the through-hole.

An embodiment of this package substrate, for example, is shown by FIG. 1, in which the conductor plug 1 is a sinter of any one of the above-mentioned conductor pastes according to the present invention.

C. Method for Plugging a Through-Hole

A method for plugging a through-hole in a ceramic substance, according to the present invention, includes, in combination, the steps of:

a) mixing a vehicle, an electrically conductive powder, and a swelling agent to form a conductor paste, with swelling of the swelling agent being initiated by application of heat to thereby initiate swelling of the conductor paste;

b) inserting the conductor paste into the through-hole; and c) sintering the conductor paste to thereby permit swelling of the swelling agent and conductor paste to maximize the plugging of the through-hole in the ceramic substance.

In an embodiment of this method, the ceramic substance has opposing faces, the swelling agent includes a crystal phase which appears during the step of sintering the conductor paste, with the crystal phase remaining stable and shrinking uniformly after the step of sintering whereby the powder forms consolidated sinters, and the step of inserting the conductor paste into the through-hole includes inserting a sufficient quantity of conductor paste into the through-hole such that, after the step of sintering and after the sinters have consolidated, the consolidated sinters extend beyond the opposing faces, and a step of leveling the opposing faces is further included.

A method for plugging a through-hole in a ceramic layered structure having at least two layers of a ceramic substance to be sintered together, according to the present invention, includes, in combination, the steps of:

a) mixing a vehicle, an electrically conductive powder, and a swelling agent to form a conductor paste, with swelling of the swelling agent being initiated by sintering to thereby initiate swelling of the conductor paste;

b) inserting the conductor paste into the through-hole; and c) sintering the at least two layers of the ceramic substance together so as to also sinter the conductor paste to thereby permit swelling of the conductor paste to maximize the plugging of the through-hole in the ceramic substance.

In an embodiment of this method, a step of leveling opposing faces of the ceramic layered structure after the step c) is further included.

The present invention is illustrated by the following examples of some preferred embodiments. However, these examples in no way limit the scope of the invention.

EXAMPLE 1

20 parts by weight of a vehicle was added to and mixed with 100 parts by weight of silver powder (average particle size 5.0 µm) and the resultant mixture was kneaded using a three-roll mill, thus obtaining a silver paste. A mixture of 15 parts by weight of ethylcellulose dissolved in 100 parts by weight of terpineol was used for the vehicle.

Next, per 100 parts by weight of electrically conductive powder, 3.9 parts by weight of swelling agent, 6.7 parts by weight of an adhesion improver, 0.6 parts by weight of an auxiliary adhesion improver and 20 parts by weight of vehicle were mixed and then kneaded using a three-roll mill, thus obtaining an additive paste. This paste and the silver paste were mixed and kneaded to obtain a conductor paste.

The swelling agent comprised a powder of kaolin (average particle size 0.25 µm) and calcium carbonate (average particle size 0.3 µm) which was mixed and calcined at about 870° C. The composition of the calcined powder was determined to be $CaO:Al_2O_3:SiO_2=1.1:1.0:2.4$. A $B_2O_3$—ZnO—PbO—based glass powder of average particle size 3.5 µm (sold as ASF-1440 and manufactured by the Asahi Glass Co.) was used as the adhesion improver, and $TiO_2$ powder of average particle size 0.3 µm (manufactured by Ishihara Sangyo Co.) was used as the auxiliary adhesion improver.

In the sections "Evaluation of Adhesive Strength" and "Evaluation of Conductor Resistance Value" below, the evaluations were carried out with a conductor plug disposed on an alumina substrate since it is difficult to make such evaluations when the conductor plug is plugged into a through-hole of a substrate.

1. Evaluation of Adhesive Strength

The conductor paste of Example 1 was printed in a plurality of 2-mm-square pats on an alumina substrate of 96% purity (3 inch, 0.635 t) using a 200-mesh stainless steel screen. This was dried for 10 minutes at 150° C. in a clean oven and then sintered for 60 minutes at 850° C. in a continuous sintering oven. A tin-plated soft copper wire 0.6 mm in diameter was soldered (using eutectic solder containing 2% silver) onto the 2 mm square pats on the substrate with a soldering iron and then the lead wire was bent to 90° to the substrate and the tensile strength (peel strength) was measured. The result for the average adhesive strength of 20 points with 2 mm pats was 2.31 Kg.

2. Evaluation of Conductor Resistance Value

A wiring pattern using the conductor paste of Example 1 was printed onto an alumina substrate of 96% purity (3 inch square, 0.635 t). This was dried for 10 minutes at 150° C. in a clean oven and then sintered for 60 minutes at 850° C. in a continuous sintering furnace, thus obtaining an alumina substrate having a line-like conductor film.

The film thickness, the line width and the resistance value were measured for the conductor film on the alumina substrate surface, and the conductor resistance value was calculated from these values. Five samples were prepared and a value of 7.9 µΩ.cm was obtained as the average conductor resistance value.

3. Evaluation of the Conductor Plug a. Evaluation of Conductor Plug Chipping

The conductor paste of Example 1 was plugged into an alumina substrate of 96% purity (84.0 mm×69.0 mm×0.635 mm t) having through-holes (600 in number) of 0.2 mm in diameter, using stainless steel metal masks of 0.1 mm sheet thickness (diameter 0.3 mm). This substrate was dried for 10 minutes at 150° C. in a clean oven and then sintered for 60 minutes at 850° C. in a continuous sintering furnace. A leveling process was then carried out in order to completely remove the conductor material which protruded from or remained around the through-holes on the substrate surface. The plugged through-holes were examined with a stereoscope. The surface of the plugged through-holes were not chipped nor had any conductor plugs fallen out of the through-holes. Furthermore, after cutting through the plugged through-hole and observing the cross section, it was confirmed that the through-hole wall face and the conductor plug adhered to each other with no gaps and that there was a uniform adhesion reaction layer on the wall face throughhole.

b. Evaluation of Gas Permeability

Figure 5:
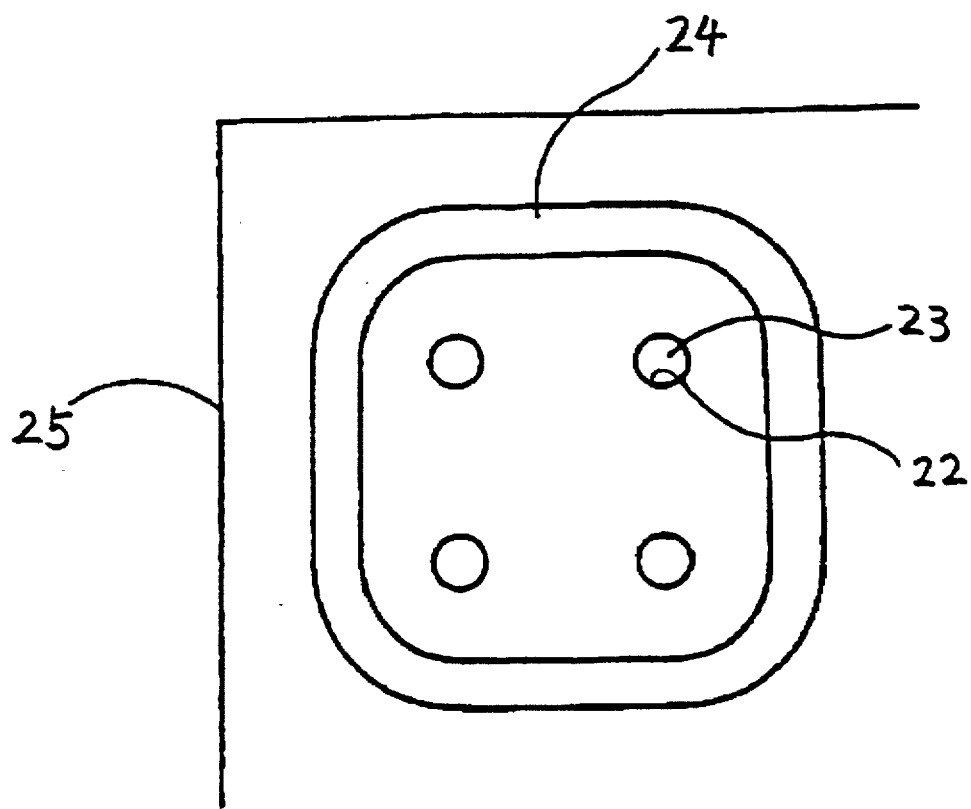
FIG. 5 is a screen printing pattern used for inspection and testing of the gas permeability of the ceramic substrates shown in the Examples.

As shown in FIG. 5, after through-holes 22 were plugged with conductor paste 23 and sintered, a pattern 24 was formed by screen printing on the surface of the substrate 25 and subjected to the grinding process described above, using a thick film silver/platinum paste (QS-171, manufactured by the DuPont Co.), and this was dried for 10 minutes at 150° C. in a clean oven and then sintered for 60 minutes at 850° C. in a continuous sintering oven.

Next, cream solder (manufactured by the Nippon Solder Co.) was printed onto this pattern using a copper plate metal mask, and a metal cap (6 in FIG. 1) was mounted over the top of the through-holes 22. Soldering was then carried out by passing the substrate 25 and the metal cap 6 through a hot draught re-flow oven, thus obtaining a sample for the evaluation of gas permeability. One hundred samples were prepared for this evaluation.

The samples were cleaned with "Chlorosen" and a gross leak test was carried out at 125° C. in "Fluorinate" (FC-40, manufactured by the Sumitomo 3M Co.). No bubbles were observed. Next, a fine leak test was carried out using a He leak tester (manufactured by the Biiko Co.) with these samples, and with all of the samples at most $1.0 \times 10^{-8}$ atm.cc/sec was only observed, which was the limiting value of the apparatus.

COMPARATIVE EXAMPLE 1

Per 100 parts by weight of electrically conductive powder, 20 parts by weight of a vehicle was added to and mixed with 100 parts by weight of silver powder (average particle size 5.0 μm) and the resultant mixture was kneaded using a three-roll mill, thus obtaining a silver paste. A mixture of 15 parts by weight of ethylcellulose dissolved in 100 parts by weight of terpineol was used for the vehicle. No swelling agent, adhesion improver or auxiliary adhesion improver was used.

In the sections "Evaluation of Adhesive Strength" and "Evaluation of Conductor Resistance Value" below, the evaluations were carried out with a conductor plug disposed on an alumina substrate since it is difficult to make such evaluations when the conductor plug is plugged into a through-hole of a substrate.

1. Evaluation of Adhesive Strength

The conductor paste of Comparative Example 1 was printed in a plurality of 2-mm-square pats on an alumina substrate of 96% purity 3 inch, 0.635 t) using a 200-mesh stainless steel screen. This was dried for 10 minutes at 150° C. in a clean oven and then sintered for 60 minutes at 850° C. in a continuous sintering oven. A tin-plated soft copper wire 0.6 mm in diameter was soldered (using eutectic solder containing 2% silver) onto the 2 mm square pats on the substrate with a soldering iron and then the lead wire was bent to 90° to the substrate and the tensile strength (peel strength) was measured. The result for the average adhesive strength of 20 points with 2 mm pats was 0.6 Kg.

2. Evaluation of Conductor Resistance Value

A wiring pattern using the conductor paste of Comparative Example 1 was printed onto an alumina substrate of 96% purity (3 inch square, 0.635 t). This was dried for 10 minutes at 150° C. in a clean oven and then sintered for 60 minutes at 850° C. in a continuous sintering furnace, thus obtaining an alumina substrate having a line-like conductor film.

The film thickness, the line width and the resistance value were measured for the conductor film on the alumina substrate surface, and the conductor resistance value was calculated from these values. Five samples were prepared and a value of 4.3 μΩ.cm was obtained as the average conductor resistance value.

3. Evaluation of the Conductor Plug a. Evaluation of Conductor Plug Chipping

The conductor paste of Comparative Example 1 was plugged into an alumina substrate of 96% purity (84.0 mm ×69.0 mm×0.635 mm t) having through-holes (600 in number) of 0.2 mm in diameter, using stainless steel metal masks (diameter 0.3 mm) of 0.1 mm sheet thickness. This substrate was dried for 10 minutes at 150° C. in a clean oven and then sintered for 60 minutes at 850° C. in a continuous sintering furnace. A leveling process was then carried out in order to completely remove the conductor material which protruded from or remained around the through-holes on the substrate surface. The plugged through-holes were examined with a stereoscope. 65% of the plugged through-holes were found to be chipped and 12% of the conductor plugs were found to have fallen out of the through-holes. Furthermore, all of the samples were found to have a uniform gap between the conductor plug and the wall face of the through-hole and no adhesion reaction layer could be observed.

b. Evaluation of Gas Permeability

As shown in FIG. 5, after through-holes 22 were plugged with conductor paste 23 produced in Comparative Example 1 and sintered, a pattern 24 was formed by screen printing on the surface of the substrate 25 and subjected to the grinding process described above, using a thick film silver/platinum paste (QS-171, manufactured by the DuPont Co.), and this was dried for 10 minutes at 150° C. in a clean oven and then sintered for 60 minutes at 850° C. in a continuous sintering oven.

Next, cream solder (manufactured by the Nippon Solder Co.) was printed onto this pattern using a copper plate metal mask, and a metal cap (6 in FIG. 1) was mounted over the top of the through-holes 22. Soldering was then carried out by passing the substrate 25 and the metal cap 6 through a hot draught re-flow oven, thus obtaining a sample for the evaluation of gas permeability. One hundred samples were prepared for this evaluation.

The samples were cleaned with "Chlorosen" and a gross leak test was carried out at 125° C. in "Fluorinate" (FC-40, manufactured by the Sumitomo 3M Co.). 95% of the samples were found to be leaking and therefor no fine leak test was carried out.

EXAMPLE 2

20 parts by weight of a vehicle was added to and mixed with 100 parts by weight of silver powder (average particle size 5.0 μm) and the resultant mixture was kneaded using a three-roll mill, thus obtaining a silver paste. A mixture of 15 parts by weight of ethylcellulose dissolved in 100 parts by weight of terpineol was used for the vehicle.

Next, per 100 parts by weight of electrically conductive powder, 3.9 parts by weight of swelling agent, 6.7 parts by weight of an adhesion improver, and 20 parts by weight of vehicle were mixed and then kneaded using a three-roll mill, thus obtaining an additive paste. This paste and the silver paste were mixed and kneaded to obtain a conductor paste. No auxiliary adhesion improver was used in this Example.

The swelling agent comprised a powder of kaolin (average particle size 0.25 μm) and calcium carbonate (average particle size 0.3 μm) which was mixed and calcined at about 870° C. The composition of the calcined powder was determined to be $CaO:Al_2O_3:SiO_2=1.1:1.0:2.4$. A $B_2O_3$—$ZnO$—$PbO$—based glass powder of average particle size 3.5 μm (sold as ASF-1440 and manufactured by the Asahi Glass Co.) was used as the adhesion improver.

In the sections "Evaluation of Adhesive Strength" and "Evaluation of Conductor Resistance Value" below, the evaluations were carried out with a conductor plug disposed on an alumina substrate since it is difficult to make such evaluations when the conductor plug is plugged into a through-hole of a substrate.

1. Evaluation of Adhesive Strength

The conductor paste of Example 2 was printed in a plurality of 2-mm-square pats on an alumina substrate of 96% purity (3 inch, 0.635 t) using a 200-mesh stainless steel screen. This was dried for 10 minutes at 150° C. in a clean oven and then sintered for 60 minutes at 850° C. in a continuous sintering oven. A tin-plated soft copper wire 0.6 mm in diameter was soldered (using eutectic solder containing 2% silver) onto the 2 mm square pats on the substrate with a soldering iron and then the lead wire was bent to 90° to the substrate and the tensile strength (peel strength) was measured. The result for the average adhesive strength of 20 points with 2 mm pats was 2.1 Kg.

2. Evaluation of Conductor Resistance Value

A wiring pattern using the conductor paste of Example 2 was printed onto an alumina substrate of 96% purity (3 inch square, 0,635 t). This was dried for 10 minutes at 150° C. in a clean oven and then sintered for 60 minutes at 850° C. in a continuous sintering furnace, thus obtaining an alumina substrate having a line-like conductor film.

The film thickness, the line width and the resistance value were measured for the conductor film on the alumina substrate surface, and the conductor resistance value was calculated from these values. Five samples were prepared and a value of 6.3 μΩ.cm was obtained as the average conductor resistance value.

3. Evaluation of the Conductor Plug a. Evaluation of Conductor Plug Chipping

The conductor paste of Example 2 was plugged into an alumina substrate of 96% purity (84.0 mm×69.0 mm=0.635 mm t) having through-holes (600 in number) of 0.2 mm in diameter, using stainless steel metal masks of 0.1 mm sheet thickness (diameter 0.3 mm). This substrate was dried for 10 minutes at 150° C. in a clean oven and then sintered for 60 minutes at 850° C. in a continuous sintering furnace. A leveling process was then carried out in order to completely remove the conductor material which protruded from or remained around the through-holes on the substrate surface. The plugged through-holes were examined with a stereoscope. The plugged through-holes were found not to be chipped nor had any conductor plugs fallen out of the through-holes. However, on observation of the cross section of the plugged through-holes, some small gaps were confirmed between the wall face of the through-hole and the conductor plug. Furthermore, no adhesion reaction layer could be observed at the boundary between the conductor plug and the wall face of the through-hole.

b. Evaluation of Gas Permeability

As shown in FIG. 5, after through-holes 22 were plugged with conductor paste 23 produced in Example 2 and sintered, a pattern 24 was formed by screen printing on the surface of the substrate 25 and subjected to the grinding process described above, using a thick film silver/platinum paste (QS-171, manufactured by the DuPont. Co.), and this was dried for 10 minutes at 150° C. in a clean oven and then sintered for 60 minutes at 850° C. in a continuous sintering oven.

Next, cream solder (manufactured by the Nippon Solder Co.) was printed onto this pattern using a copper plate metal mask, and a metal cap (6 in FIG. 1) was mounted over the top of the through-holes 22. Soldering was then carried out by passing the substrate 25 and the metal cap 6 through a hot draught re-flow oven, thus obtaining a sample for the evaluation of gas permeability. One hundred samples were prepared for this evaluation.

The samples were cleaned with "Chlorosen" and a gross leak test was carried out at 125° C. in "Fluorinate" (FC-40, manufactured by the Sumitomo 3M Co.). No bubbles were observed. Next, a fine leak test was carried out using a He leak tester (manufactured by the Biiko Co.) with these samples, and with all of the samples at most 5.0×10⁻⁸ atm.cc/sec was only observed.

EXAMPLE 3

20 parts by weight of a vehicle was added to and mixed with 100 parts by weight of silver powder (average particle size 5.0 μm) and the resultant mixture was kneaded using a three-roll mill, thus obtaining a silver paste. A mixture of 15 parts by weight of ethylcellulose dissolved in 100 parts by weight of terpineol was used for the vehicle.

Next, per 100 parts by weight of electrically conductive powder, 3.9 parts by weight of swelling agent, 0.6 parts by weight of an auxiliary adhesion improver and 20 parts by weight of vehicle were mixed and then kneaded using a three-roll mill, thus obtaining an additive paste. This paste and the silver paste were mixed and kneaded to obtain a conductor paste. No adhesion improver was used in this Example.

The swelling agent comprised a powder of kaolin (average particle size 0.25 μm) and calcium carbonate (average particle size 0.3 μm) which was mixed and calcined at about 870° C. The composition of the calcined powder was determined to be $CaO:Al_2O_3:SiO_2=1.1:1.0:2.4$. $TiO_2$ powder of average particle size 0.3 μm (manufactured by Ishihara Sangyo Co.) was used as the auxiliary adhesion improver.

In the sections "Evaluation of Adhesive Strength" and "Evaluation of Conductor Resistance Value" below, the evaluations were carried out with a conductor plug disposed on an alumina substrate since it is difficult to make such evaluations when the conductor plug is plugged into a through-hole of a substrate.

1. Evaluation of Adhesive Strength

The conductor paste of Example 3 was printed in a plurality of 2-mm-square pats on an alumina substrate of 96% purity (3 inch, 0.635 t) using a 200-mesh stainless steel screen. This was dried for 10 minutes at 150° C. in a clean oven and then sintered for 60 minutes at 850° C. in a continuous sintering oven. A tin-plated soft copper wire 0.6 mm in diameter was soldered (using eutectic solder containing 2% silver) onto the 2 mm square pats on the substrate with a soldering iron and then the lead wire was bent to 90° to the substrate and the tensile strength (peel strength) was measured. The result for the average adhesive strength of 20 points with 2 mm pats was 0.5 Kg.

2. Evaluation of Conductor Resistance Value

A wiring pattern using the conductor paste of Example 3 was printed onto an alumina substrate of 96% purity (3 inch square, 0.635 t). This was dried for 10 minutes at 150° C. in a clean oven and then sintered for 60 minutes at 850° C. in a continuous sintering furnace, thus obtaining an alumina substrate having a line-like conductor film.

The film thickness, the line width and the resistance value were measured for the conductor film on the alumina substrate surface, and the conductor resistance value was calculated from these values. Five samples were prepared and a value of 17 μΩ.cm. was obtained as the average conductor resistance value.

3. Evaluation of the Conductor Plug a. Evaluation of Conductor Plug Chipping

The conductor paste of Example 3 was plugged into an alumina substrate of 96% purity (84.0 mm×69.0 mm=0.635 mm t) having through-holes (600 in number) of 0.2 mm in diameter, using stainless steel metal masks of 0.1 mm sheet thickness (diameter 0.3 mm). This substrate was dried for 10 minutes at 150° C. in a clean oven and then sintered for 60 minutes at 850° C. in a continuous sintering furnace. A leveling process was then carried out in order to completely remove the conductor material which protruded from or remained around the through-holes on the substrate surface. The plugged through-holes were examined with a stereoscope. Although 71% of the plugged through-holes were observed to be chipped, none of the conductor plugs had fallen out of the through-holes. Furthermore, no gaps were observed in the cross sections of the conductor plug and the wall face of the through-hole, but there was no adhesion between the conductor plug and the wall face and no adhesion reaction layer was observed.

b. Evaluation of Gas Permeability

As shown in FIG. 5, after through-holes 22 were plugged with conductor paste 23 produced in Example 3 and sintered, a pattern 24 was formed by screen printing on the surface of the substrate 25 and subjected to the grinding process described above, using a thick film silver/platinum paste (QS-171, manufactured by the DuPont Co.), and this was dried for 10 minutes at 150° C. in a clean oven and then sintered for 60 minutes at 850° C. in a continuous sintering oven.

Next, cream solder (manufactured by the Nippon Solder Co.) was printed onto this pattern using a copper plate metal mask, and a metal cap (6 in FIG. 1) was mounted over the top of the through-holes 22. Soldering was then carried out by passing the substrate 25 and the metal cap 6 through a hot draught re-flow oven, thus obtaining a sample for the evaluation of gas permeability. One hundred samples were prepared for this evaluation.

The samples were cleaned with "Chlorosen" and a gross leak test was carried out at 125° C. in "Fluorinate" (FC-40, manufactured by the Sumitomo 3M Co.). The formation of bubbles from the plugged through-holes was confirmed in the gross leak tests, and the rate of occurrence was 92%. There was no fine leak test performed.

It is clear from the results outlined above that the conductor paste of the present invention can prevent conductor plugs from falling out of the through-holes and lower the incidence of chipping. Furthermore, if an adhesion improver and/or an auxiliary adhesion improver are used, it is possible to prevent gaps between the conductor plugs and the wall face of the through-holes and to improve adhesion to the ceramic substrate. Moreover, it was confirmed that a conductor plug obtained by sintering a conductor paste of the present invention has a conductor resistance value which is sufficiently low for a circuit board and can have the gas impermeability which is required for a package substrate.

EXAMPLE 4

The preparation of samples for evaluation, and the evaluation of the adhesive strength, the conductor resistance value, the through-hole plugging, and the gas permeability, were carried out in the same way as of Example 1 except that 100 parts by weight of silver powder (average particle size 5.0 µm) was replaced with 50 parts by weight of silver powder (average particle size 30 µm) and 50 parts by weight of silver powder (average particle size 1 µm).

As a result, values, on the average, of adhesive strength 2.3 Kg and conductor resistance value 7 µΩ.cm were obtained.

On observing the surface after the grinding process in the through-hole plugging evaluation, it was confirmed that a good adhesion reaction layer was formed as in Example 1.

In the gross leak test in the evaluation of the gas permeability, no bubbles were observed. And in the fine leak test, with all of the samples at most $1.0 \times 10^{-8}$ atm.cc/sec was only observed, which was the limiting value of the apparatus.

REFERENCE EXAMPLES

Four types of conductive powders were created. Per 100 parts by weight of silver powder with an average particle size of 5.0 µm, (1) 1.0 part by weight, (2) 3.0 parts by weight, (3) 5.0 parts by weight and (4) 10.0 parts by weight, respectively, of swelling agent were compounded with the silver powder and dry mixed to obtain four types of raw conductive powder. The swelling agent comprised a powder in which kaolin of an average particle size of 0.25 µm and calcium carbonate of an average particle size 0.3 µm were mixed and calcined at about 870° C. The composition of the calcined powder was determined to be $CaO:Al_2O_3:SiO_2=$ 1.1:1.0:2.4.

Conductor plugs were obtained by weighing out 1.0 gram of each of these four types of powders and subjecting them to uniaxial pressing at 100 Kg/cm$^2$ using a metal mold of 6.95 mm in diameter. These plugs were sintered for 60 minutes at 850° C. in a continuous sintering oven.

In the sections "Evaluation of Shrinkage During Sintering" and "Evaluation of Consolidatability" described below, the evaluations were conducted on free conductor plugs since it is difficult to conduct these types of evaluations on conductor plugs inserted in a through-hole. In addition, the conductor plugs prepared in these reference examples do not contain a vehicle. The vehicle is volatilized (degreased) before sintering the raw material powder and therefore even though no vehicle was included, this should have no direct effect on the shrinkage and the crystallization of the resultant sinters.

1. Evaluation of Shrinkage During Sintering

Figure 6:
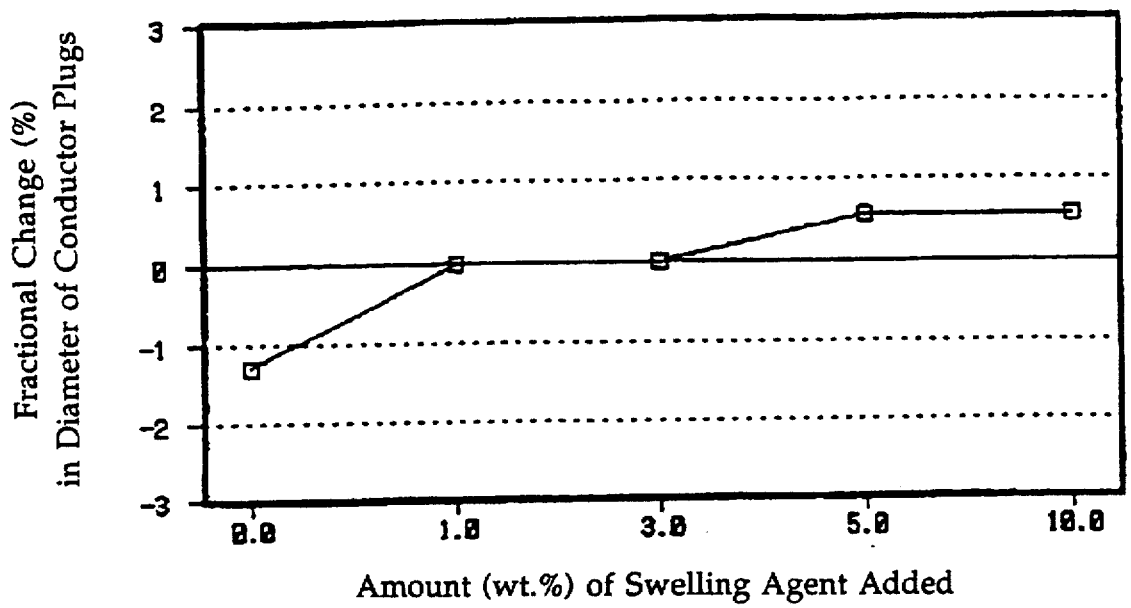
FIG. 6 is a graph which shows the results of an evaluation of the fractional sintering shrinkages of the conductor plugs obtained in the Reference Examples.

The diameters of the sinters obtained in the Reference Examples were measured and the fractional change was evaluated. The results are shown in FIG. 6.

2. Evaluation of Ability To Consolidate

Figure 7:
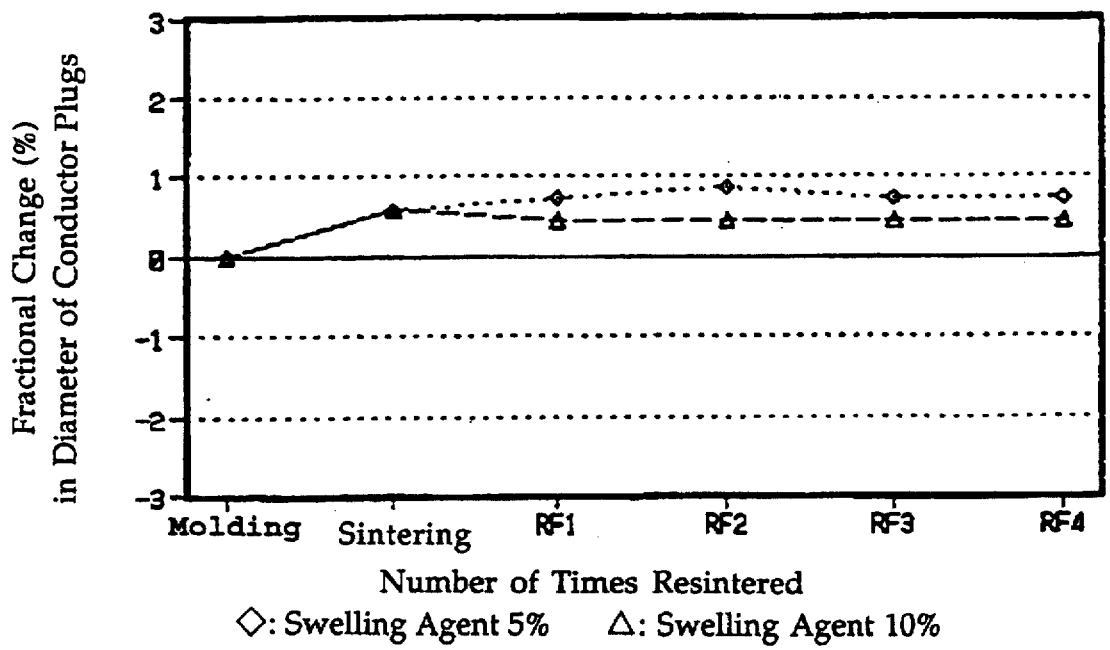
FIG. 7 is a graph which shows the results of an evaluation of the consolidatability of the conductor plugs obtained in the Reference Examples.

The consolidation stability due to thermal hysteresis after sintering was evaluated using the conductor plugs compounded with 3% of swelling agent and the conductor plugs compounded with 5% of swelling agent prepared in the Reference Examples. The sintered conductor plugs were resintered up to 4 times for 60 minutes at 850° C. in a continuous sintering furnace. The diameter of the conductor plugs were measured after sintering and their fractional change was evaluated. The results are shown in FIG. 7.

COMPARATIVE REFERENCE EXAMPLES

Conductor plugs were obtained by weighing out 1.0 gram of silver powder with an average particle size of 5.0 µm and subjecting them to uniaxial pressing at 100 Kg/cm$^2$ using a metal mold of 6.95 mm in diameter. These conductor plugs were sintered for 60 minutes at 850° C. in a continuous sintering oven. No swelling agent was added.

In the sections "Evaluation of Shrinkage During Sintering" and "Evaluation of Consolidatability" described below, the evaluations were conducted on free conductor plugs since it is difficult to conduct these types of evaluations on conductor plugs inserted in a through-hole. In addition, the conductor plugs prepared in these reference examples do not contain a vehicle. The vehicle is volatilized (degreased) before sintering the raw material powder and therefore even though no vehicle was included, this should have no direct effect on the shrinkage and the crystallization of the resultant sinters.

1. Evaluation of Ability To Consolidate

Figure 8:
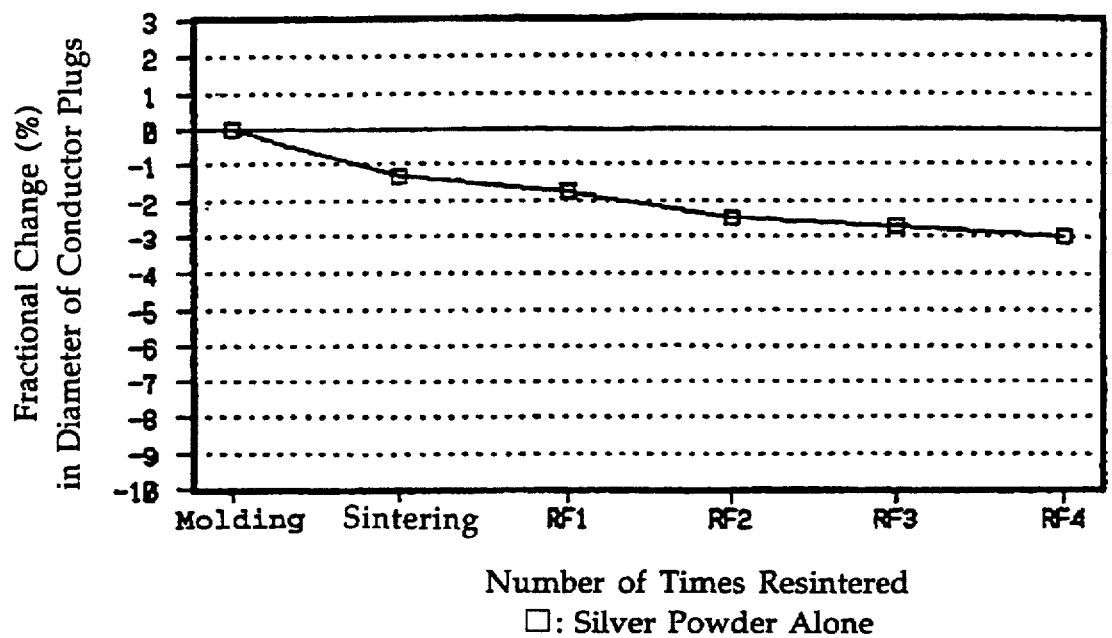
FIG. 8 is a graph which shows the results of an evaluation of the fractional sintering shrinkage and the consolidatability of the conductor plugs obtained in the Comparative Reference Example.

The consolidation stability due to thermal hysteresis after sintering was evaluated using the conductor plugs prepared in the Comparative Reference Examples. The sintered conductor plugs were resintered up to 4 times for 60 minutes at 850° C. in a continuous sintering furnace. The diameter of the conductor plugs were measured after sintering and their fractional change was evaluated. The results are shown in FIG. 8.

It can be seen from the results outlined above that even when the amount of swelling agent added is small it has the effect of reducing the amount of shrinkage in the conductor plug. Furthermore, a conductor plug which has a swelling agent added does not shrink any further after sintering, even if it is subjected to subsequent thermal hysteresis, and its form is consolidated and stabilized.

Various details of the invention may be changed without departing from its spirit or its scope. Furthermore, the foregoing description of the embodiments according to the present invention is provided for the purpose of illustration only, and not for the purpose of limiting the invention as defined by the appended claims and their equivalents.

What is claimed is:

1. A ceramic substrate through-hole plug paste comprising:
   an electrically conductive powder which has a metal powder as its main component;
   rhodium powder in an amount at least 0.1 percent by weight and not more than 3.0 percent by weight, relative to said electrically conductive powder;
   a calcined material capable of forming a crystal phase during sintering; and
   a vehicle.

2. A ceramic substrate through-hole plug paste according to claim 1, wherein said metal powder is at least one type selected from the group consisting of gold powder, silver powder, copper powder, a mixture of silver and platinum powders, and a mixture of silver and palladium powders.

3. A ceramic substrate through-hole plug paste according to claim 1, wherein said calcined material has the ability to consolidate after being sintered.

4. A ceramic substrate through-hole plug paste according to claim 3, wherein said calcined material comprises a calcined material of kaolin and an alkaline metal or alkaline earth metal carbonate.

5. A ceramic substrate through-hole plug paste according to claim 4, wherein said calcined material of kaolin and an alkaline metal or alkaline earth metal carbonate comprises a calcined material of kaolin and calcium carbonate.

6. A ceramic substrate through-hole plug paste according to claim 1, wherein said vehicle comprises a binder and a solvent.

7. A ceramic substrate through-hole plug paste according to claim 6, wherein said binder is at least one selected from the group consisting of ethylcellulose and acrylic resin, and said solvent is at least one selected from the group consisting of ethylcarbitol acetate and terpineol.

8. A ceramic substrate through-hole plug paste according to claim 1, which further comprises an adhesion improver.

9. A ceramic substrate through-hole plug paste according to claim 8, wherein said adhesion improver is glass having a softening point of 500°–1000° C.

10. A ceramic substrate through-hole plug paste according to claim 8, which further comprises an auxiliary adhesion improver.

11. A ceramic substrate through-hole plug paste according to claim 10, wherein said auxiliary adhesion improver is at least one type selected from the group consisting of $TiO_2$, $CuO$, $Cr_2O_3$, $Bi_2O_3$ and $NiO$.

12. A ceramic substrate through-hole plug paste comprising:
   an electrically conductive powder which has a metal powder as its main component, said metal powder being at least one type selected from the group consisting of gold powder, silver powder, copper powder, a mixture of silver and platinum powders, and a mixture of silver and palladium powders, and the average particle size of said metal powder being in a range between 1–100 μm;
   a calcined material of kaolin and an alkaline metal or alkaline earth metal carbonate being present in a range of 0.5–15 parts by weight per 100 parts by weight of the electrically conductive powder;
   a vehicle comprising a binder and a solvent, wherein said vehicle is present in a range between 10–45 parts by weight per 100 parts by weight of electrically conductive powder, said binder is at least one type selected from the group consisting of ethylcellulose and acrylic resin and is present in a range between 2–10 parts by weight per 100 parts by weight of the electrically conductive powder, and said solvent is at least one type selected from the group consisting of ethylcarbitol acetate and terpineol and is present in a range between 300–2000 parts by weight per 100 parts by weight of the binder;
   an adhesion improver, said adhesion improver being at least one type selected from the group consisting of $PbO$, $B_2O_3$, $ZnO$, $CaO$, $SiO_2$ and $Al_2O_3$;
   an auxiliary adhesion improver, said auxiliary adhesion improver being at least one type selected from the group consisting of $TiO_2$, $CuO$, $Cr_2O_3$, $Bi_2O_3$ and $NiO$; and
   rhodium powder in an amount of at least 0.1 percent by weight, and not more than 3.0 percent by weight, relative to said electrically conductive powder and with an average particle size between 0.1–2.0 μm.

13. A ceramic substrate through-hole plug paste, comprising per 100 parts by weight of an electrically conductive powder:
   20 parts by weight of a silver powder with an average particle size of 5.0 μm;
   3.9 parts by weight of a swelling agent comprising a calcined mixture of kaolin with an average particle size of 0.25 μm and calcium carbonate with an average particle size of 0.3 μm;
   40 parts by weight of a vehicle, comprising 30 parts by weight of ethylcellulose dissolved in 200 parts by weight of terpineol;
   6.7 parts by weight of an adhesion improver comprising a $B_2O_3$—$ZnO$—$PbO$ based glass powder of an average particle size of 3.5 μm; and
   an auxiliary adhesion improver comprising $TiO_2$ of an average particle size of 0.3 μm.

14. A ceramic substrate through-hole plug paste comprising:
   a vehicle;
   a first powder portion mixed in the vehicle, with the first powder portion comprising an electrically conductive powder which comprises a metal powder as its main component; and
   a second powder portion mixed in the vehicle, with the second powder portion comprising a calcined powder and a glass powder.

15. The ceramic substrate through-hole plug paste of claim 14 wherein the calcined powder is calcined from a powder comprising kaolin.

16. The ceramic substrate through-hole plug paste of claim 14 wherein the calcined powder is calcined from a powder comprising an alkaline metal or alkaline earth metal.

17. The ceramic substrate through-hole plug paste of claim 14 wherein the calcined powder is calcined from a powder comprising kaolin and an alkaline metal or alkaline earth metal.

18. The ceramic substrate through-hole plug paste of claim 14 wherein the calcined powder is calcined from a powder comprising kaolin and an alkaline metal or alkaline earth metal carbonate.

19. The ceramic substrate through-hole plug paste of claim 14 wherein the calcined powder is calcined from a powder comprising kaolin and calcium carbonate.

20. The ceramic substrate through-hole plug paste of claim 14 wherein the calcined powder is calcined from a powder comprising kaolin and an alkaline metal or alkaline earth metal salt.

21. The ceramic substrate through-hole plug paste of claim 14 wherein the calcined powder is calcined from a powder comprising kaolin and an alkaline metal or alkaline earth metal oxide.

22. The ceramic substrate through-hole plug paste of claim 14 and further comprising the step of inserting the paste into a through-hole and firing the paste.

23. A ceramic substrate through-hole plug paste comprising, before being sintered, an electrically conductive metal powder fraction, a glass powder fraction, a crystallizable powder fraction and a vehicle.

24. A ceramic substrate through-hole plug paste comprising, during sintering, an electrically conductive metal fraction, a glass fraction, and a crystal fraction and a vehicle which is burned out during sintering.

25. A ceramic substrate through-hole plug paste comprising, after being sintered, an electrically conductive metal fraction, a glass fraction, and a crystal fraction.

26. A ceramic substrate through-hole plug paste according to claim 1, wherein said calcined material contains RO, $Al_2O_3$, and $SiO_2$.

* * * * *